United States Patent
Zuniga et al.

(10) Patent No.: US 8,545,660 B1
(45) Date of Patent: Oct. 1, 2013

(54) BONDING APPARATUS AND METHOD

(75) Inventors: Steven M. Zuniga, Soquel, CA (US);
Robert D. Tolles, San Jose, CA (US);
Derek G. Aqui, Portland, OR (US);
Andrew J. Nagengast, Sunnyvale, CA (US); Anthony J. Senn, Nampa, ID (US); Keenan Leon Guerrero, Boise, ID (US)

(73) Assignee: GTAT Corporation, Nashua, NH (US)

( * ) Notice: Subject to any disclaimer, the term of this patent is extended or adjusted under 35 U.S.C. 154(b) by 30 days.

(21) Appl. No.: 13/424,984

(22) Filed: Mar. 20, 2012

Related U.S. Application Data

(63) Continuation of application No. 12/495,114, filed on Jun. 30, 2009, now Pat. No. 8,151,852.

(60) Provisional application No. 61/122,699, filed on Dec. 15, 2008.

(51) Int. Cl.
*B32B 37/00* (2006.01)

(52) U.S. Cl.
USPC .......................................... 156/228; 156/285

(58) Field of Classification Search
USPC ................. 156/228, 285, 286, 381, 382, 580, 156/581, 583.1
See application file for complete search history.

(56) References Cited

U.S. PATENT DOCUMENTS

| | | | |
|---|---|---|---|
| 4,039,643 A | 8/1977 | Dean et al. | |
| 5,478,782 A | 12/1995 | Satoh et al. | |
| 6,561,249 B2 | 5/2003 | Huber | |
| 6,626,225 B1 | 9/2003 | Kochberger | |
| RE39,484 E | 2/2007 | Bruel | |
| 7,192,841 B2 | 3/2007 | Wei et al. | |
| 7,449,071 B2 | 11/2008 | Aggarwal et al. | |
| 7,476,940 B2 | 1/2009 | Couillard et al. | |
| 7,686,052 B2 | 3/2010 | Song et al. | |
| 8,151,852 B2 * | 4/2012 | Zuniga et al. | 156/382 |
| 2002/0154975 A1 | 10/2002 | Perlov et al. | |
| 2004/0197174 A1 | 10/2004 | Van Den Berg | |
| 2007/0287264 A1 | 12/2007 | Rogers | |

FOREIGN PATENT DOCUMENTS

WO   WO-01/86034   11/2001

\* cited by examiner

*Primary Examiner* — James Sells
(74) *Attorney, Agent, or Firm* — The Mueller Law Office, P.C.

(57) ABSTRACT

A bonding apparatus and method holds first and second bodies peripherally, one above the other, on respective shelves. A lower heat-transfer body is configured to lift the first body from below and press the first and second bodies against an upper heat-transfer body to enable bonding between the first and second bodies.

10 Claims, 12 Drawing Sheets

BONDING APPARATUS AND METHOD

RELATED APPLICATION

This application is a continuation of U.S. application Ser. No. 12/495,114, entitled BONDING APPARATUS AND METHOD, filed by Steven M. Zuniga on Jun. 30, 2009, now U.S. Pat. No. 8,151,852 the contents of which are hereby incorporated in their entirety. U.S. application Ser. No. 12/495,114 claims the benefit of U.S. Provisional Application Ser. No. 61/122,699, entitled APPARATUS AND METHOD FOR MANUFACTURING AN ASSEMBLY HAVING A THIN LAMINA BONDED TO A BASE SUBSTRATE, filed by Aditya Agarwal on Dec. 15, 2008, the contents of which are hereby incorporated in their entirety.

BACKGROUND OF THE INVENTION

1. Field of the Invention

This invention relates to bonding systems, particular apparatus and methods for forming a bonded structure incorporating a semiconductor layer.

2. Background Information

A layered assembly incorporating a semiconductor wafer is a structure useful for forming devices such as transistors, displays and microelectromechanical systems. A basic step of manufacturing the layered assembly includes bonding a semiconductor wafer to a substrate by, for example, thermo compression, fusion, or anodic bonding.

In order to minimize the nucleation of multiple bonding fronts, and concomitant concentration of voids in the bond, it is desirable to control the development of contact between the opposing bonding faces of the wafer and substrate. Accordingly, in a conventional bonding apparatus, the semiconductor wafer and substrate are first arranged with their respective bonding faces separated across a narrow separation. Commonly the bonding apparatus provides small peripheral spacers that are inserted between the stacked wafer and substrate to keep the bodies separate. After contact between the two facing surfaces has been initiated, the spacers are retracted.

The use of spacers may introduce difficulties into the bonding process. Mechanical contact between the spacers and the bonding surfaces of the two bodies may cause undesirable scratching, contamination, or particle generation and thereby compromise the quality of the bond and the performance of the ultimate device. In more extreme cases, the spacers may become stuck fast between and ruin the two bodies. The spacers may be thin and prone to break, thereby reducing reliability of the bonding apparatus and compromising throughput due to downtime for maintenance. Also, managing the deployment and retraction of the spacers increases the complexity and expense of the bonding apparatus.

There is, accordingly, a need for a bonding system enabling management of contact development between the two bodies being bonded without interposed spacers.

SUMMARY OF THE INVENTION

A bonding system adapted to bond a first body to a second body comprises a lower support shelf adapted to hold the first body and an upper support shelf adapted to hold the second body. The lower support shelf defines a first interior space corresponding in lateral extent to the first body. The upper support shelf defines a second interior space corresponding in lateral extent to the second body. For some vertical plane passing through both of the first and second interior spaces, the second interior space has a lateral dimension, an intersection between the vertical plane and the second interior space, that is longer than a corresponding lateral dimension, an intersection of the vertical plane with the first interior space. The support shelves are stationary and configured so that the first and second bodies disposed on the lower and upper shelves, respectively, are not in direct contact.

An upper heat-transfer body is disposed above and spaced apart from the second interior space. A lower heat-transfer body having an upper interface is disposed under and spaced apart from the first interior space. The lower heat-transfer body is capable of rising so that the upper interface enters the first interior space. A lift assembly is configured to reversibly raise the lower heat-transfer body into the first interior space and press the lower heat-transfer body in opposition to the upper heat-transfer body.

In a bonding process joining the first and second bodies, the lift assembly raises the lower heat-transfer body to lift the first body. The lower heat-transfer body presses the first body against the second body in contact with the upper heat-transfer body. As the first and second bodies are sandwiched between the lower and upper heat-transfer bodies, force transmitted to the contact area between the first and second bodies and heat transferred from the heat-transfer bodies to the first and second bodies contribute to creating a bonded pair.

BRIEF DESCRIPTION OF THE DRAWINGS

The invention description below refers to the accompanying drawings, wherein identical reference symbols designate like structural elements, and in which.

Features in the figures are not, in general, drawn to scale.

DETAILED DESCRIPTION OF AN ILLUSTRATIVE EMBODIMENT

Figure 1:
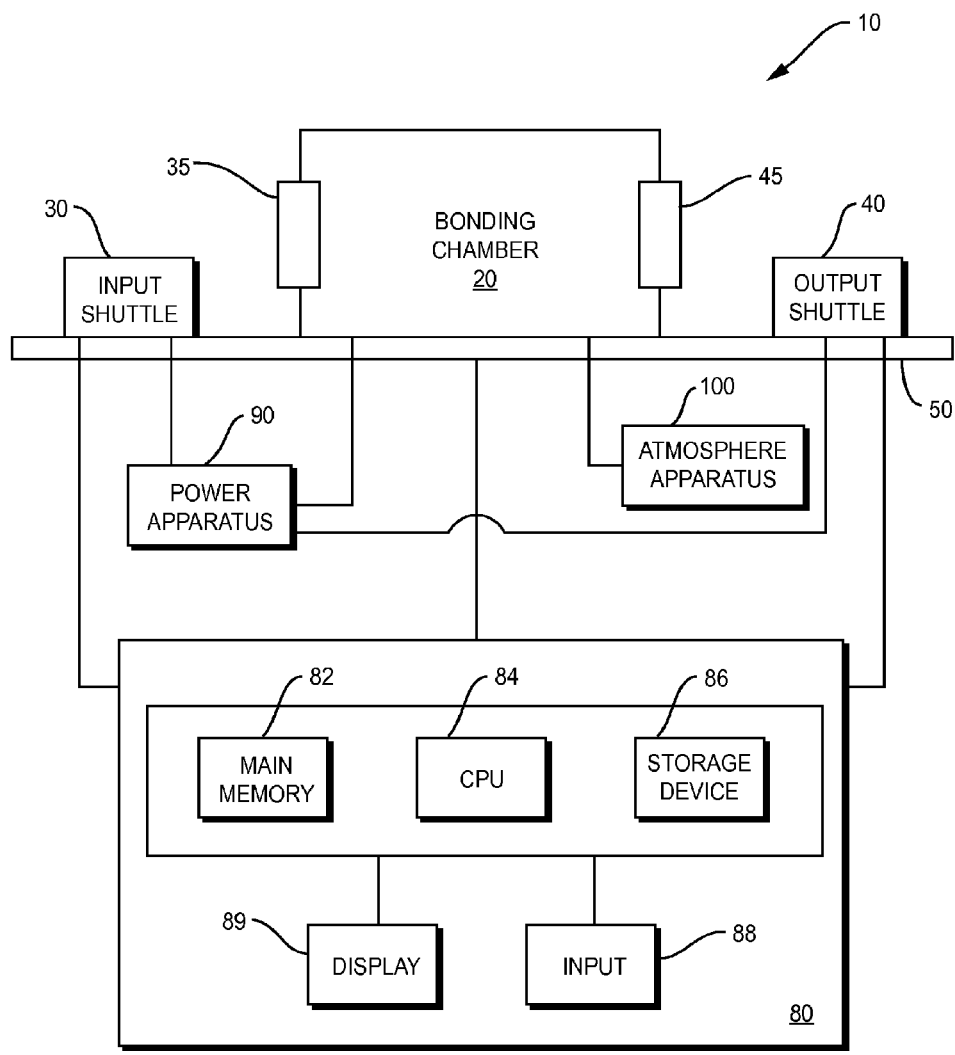
FIG. 1 is a block diagram of a bonding system compatible with the invention.

With reference to FIG. 1, in an illustrative embodiment, a bonding system 10 for bonding two substantially planar bodies comprises a bonding chamber 20, accessible through an input port 35 and an output port 45, an input shuttle 30 and an output shuttle 40, all anchored to a base plate 50.

A power apparatus 90 is operatively coupled to the input and output ports 35 and 45 and to components of the bonding chamber 20 that move, generate heat or assume a desired electrical potential. The components are described below with reference to FIG. 2.

An atmosphere apparatus 100 is configured to regulate the atmosphere in the bonding chamber 20. Vacuum or pressure sensors (not shown) may be disposed in the bonding chamber 20 and coupled to provide feedback regulating operation of the atmosphere apparatus 100. The atmosphere apparatus 100 may, e.g., alternately admit components, such as inert gas or air, or remove components from the bonding chamber 20 to maintain desired conditions. Practices for managing the temperature and composition of the environment in a container such as the bonding chamber 20 are known to those skilled in the art.

A computer system 80 is programmable and includes a main memory 82, a central processing unit (CPU) 84, and a storage device 86, operatively coupled to an input device 88 and a display 89. A graphical user interface, software programs, and experimental parameters may be stored in the main memory 82. The computer system 80 is configured to cooperate with the power apparatus 90, the atmosphere apparatus 100, components of the bonding chamber 20 described herein, and stress and temperature sensors to generate process conditions for bonding in the chamber 20. The process conditions may encompass, e.g., temperatures of heat-transfer bodies, bonding pressure between heat-transfer bodies, bonding atmosphere, bias voltage, heat-transfer body movement, plunger movement and pressure, which may be predetermined by a user and relayed through the is computer 80, for bonding performed in the chamber 20.

Figure 2:
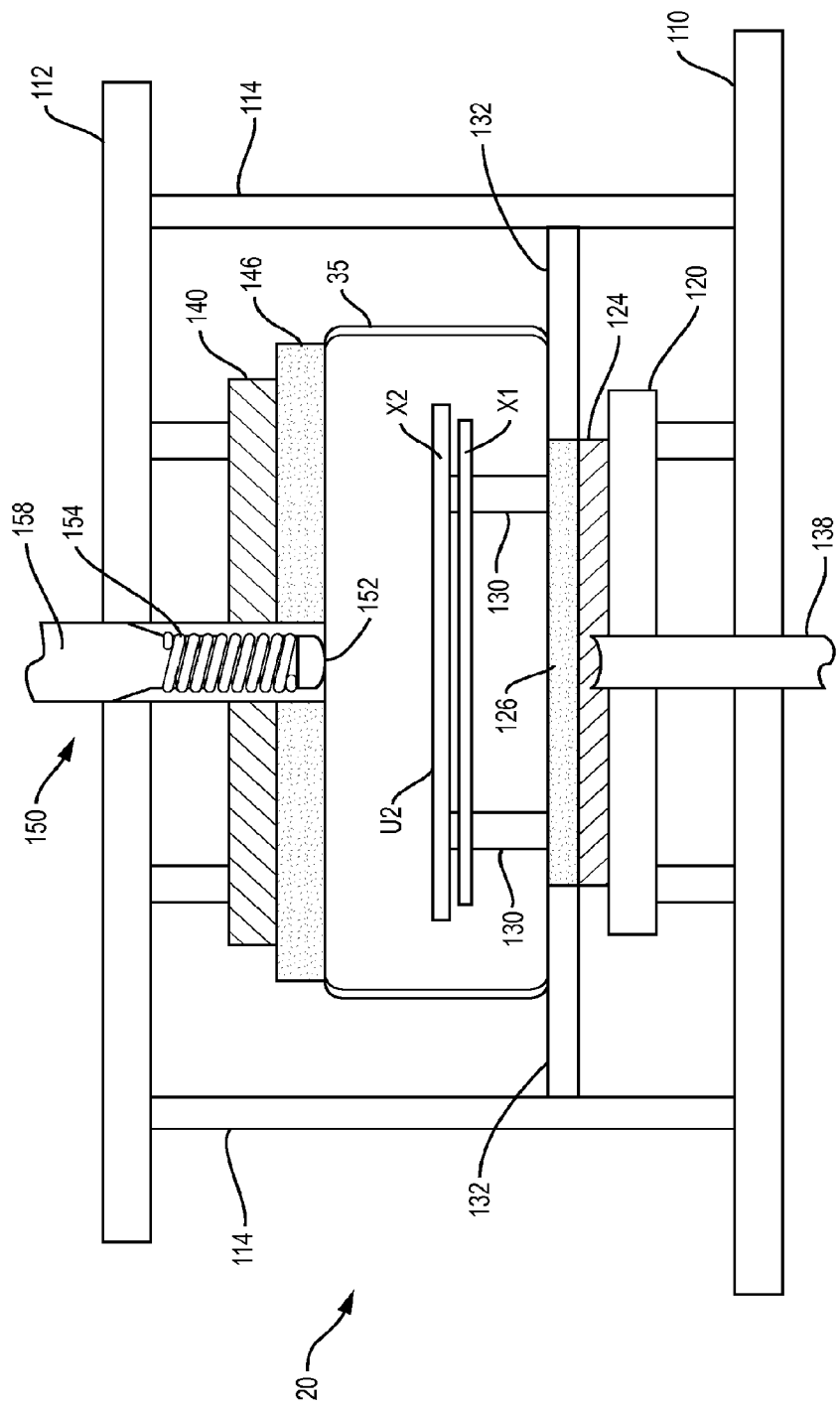
FIG. 2 is a sectional view of a bonding chamber compatible with the invention.

FIG. 2 shows an exemplary bonding chamber 20 with movable components in respective rest positions. The chamber 20 is defined by a chamber floor 110 which in use is affixed to the base plate 50 (FIG. 1), a chamber lid 112, and a cylindrical outer wall 114 (shown in cross-section in the drawing). The floor 110, lid 112 and outer wall 114 are illustratively of aluminum or stainless steel.

A lower heater 120 is supported by the chamber floor 110. A gimbal plate 124 rests above the lower heater 120 and supports a lower susceptor 126. Support pins 130 are affixed to a support plate 132 circumscribing the lower susceptor 126. The support pins 130 are configured to bear a first body X1 beneath and without touching a second body X2. An upper heater 140 and an upper susceptor 146 are borne by the chamber lid 112. Illustratively, electrically insulative material (not shown) separates the upper heater 140 and upper susceptor 146.

The lower and upper heaters 120 and 140 are coupled to the computer system 80 (FIG. 1) and operable to generate electromagnetic radiation, thereby generating heat in and altering or maintaining respective temperatures of the lower and upper susceptors 126 and 146, respectively, in accordance with a predetermined process trajectory. The lower and upper heaters 120 and 140 and susceptors 126 and 146 may be fitted with temperature and stress sensors (not shown) to provide feedback to the computer system 80. The susceptors 126 and 146 are configured to function as heat-transfer bodies, transferring heat to the bodies X1 and X2 during a bonding operation in the bonding chamber 20.

The support pins 130 are illustratively of stainless steel or quartz, which may be preferable because of its dimensional stability over a wide temperature range. The susceptors 126 and 146 may be of a thermally conductive material such as, e.g., graphite, silicon carbide, molybdenum, stainless steel, niobium, or aluminum. The heaters 120 and 140 may be constructed from resistive heating elements, for example embedded in a thermally conductive block. Candidate materials and structures for the heaters 120 and 140 and susceptors 126 and 146 are known to those skilled in the art.

The power apparatus 90 may be capable of delivering, e.g., on the order of 2,000 is watts or more to the heaters 120 and 140 to provide for relatively rapid achievement of desired processing temperatures of the susceptors 126 and 146. The power apparatus 90 may also be connected with the lower and upper susceptors 126 and 146 to allow application of a bias voltage during bonding.

The chamber floor 110 is apertured to accommodate a susceptor lift assembly 138, coupled to the computer system 80 (FIG. 1), which is configured to engage a recess in the gimbal plate 124 and operable to reversibly lift the gimbal plate 124 and the lower susceptor 126. The susceptor lift assembly 138 has range sufficient to move the lower susceptor 126 up to the lower surface of the first body X1 and continue upward until the second body X2 is held against the upper susceptor 146, sandwiched with the first body X1 between the two susceptors 126 and 146. The susceptor lift assembly 138 is furthermore configured to press the lower susceptor 126 in opposition to the upper susceptor 146 to apply a bonding pressure at the interface between the first body X1 and the second body X2, as predetermined by the user and communicated through the computer system 80. The bonding pressure may be effected by applying a stress of, for example, several hundreds or thousands of Pascals, for example 500, 1,000, 5,000 or 8,000 Pascals or greater. The susceptor lift assembly 138 is not limited by the type of apparatus used to apply the bonding pressure and may incorporate, for example, electromechanical, pneumatic or hydraulic elements, known to those skilled in the art. As is known to those of skill in the art, a sealing mechanism (not shown) below the chamber floor 110, e.g., bellows, around the susceptor lift assembly 138 may allow movement of the assembly 138 through the floor 110 without compromising the atmosphere in the bonding chamber 20.

The gimbal plate 124 is configured to reorient the lower susceptor 126 to conform to the lower surface of the first body X1 when the lower susceptor 126 is pressing the first and second bodies X1 and X2 in opposition to the upper susceptor 146. In this way the gimbal plate 124 affords passive compensation of the orientation of the lower susceptor 126 for deviations from level of the upper susceptor 146 and imperfect planarization of either or both of the bodies X1 and X2. The gimbal plate 124 may be configured so that its gimbal point coincides with the center of the top surface of the first is body X1 resting on the support pins 130. In an alternative embodiment, the functions of the gimbal plate 124 and the lower susceptor 126 may be combined in a single element.

The chamber lid 112, upper heater 140 and susceptor 146 are centrally apertured to accommodate a plunger 150 comprising a plunger tip 152 engaged with a spring 154. The plunger tip 152 is illustratively of silicon carbide or stainless steel. A plunger drive 158, communicating with the computer system 80 (FIG. 1), is operatively coupled to the spring 154 to reversibly lower the plunger tip 152 downward to touch the second body X2. As is known to those of skill in the art, a sealing mechanism (not shown) above the chamber lid 112, e.g., bellows, around the plunger 150 may allow movement of the plunger 150 through the lid 112 without compromising the atmosphere in the bonding chamber 20.

The plunger drive 158 is configured to apply a specified force to, or to effect a specified deformation in, the second body X2 in accordance with predetermined parameters. The deformation may be, illustratively, up to about 1 mm. The power apparatus 90 is optionally configured to apply a bias, illustratively between 200 and 2,000 volts, between the lower susceptor 126 and the plunger 150.

Figure 3:
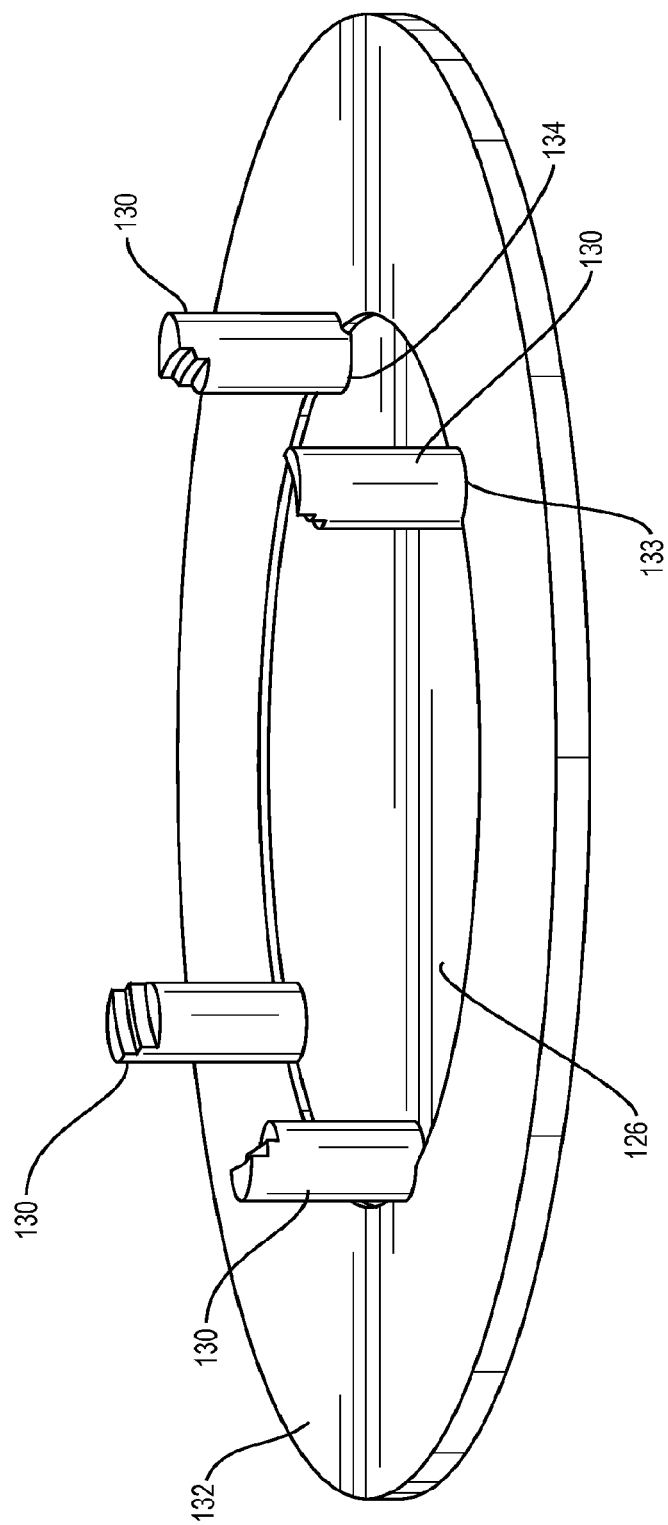
FIG. 3 is a perspective view of the support plate and pins, without the first and second bodies, of the bonding chamber shown in FIG. 2.

For clarity of illustration, FIG. 3 shows an illustrative arrangement of the support pins 130 adapted to bear two planar circular bodies. As used herein, "planar body" and similar phrases refer to a body having a thickness on the order of about 5% or less of a length characterizing its lateral extent.

In the embodiment, the support plate 132 has a generally circular aperture with four approximately semicircular outer cutouts 133 located around the aperture at 90-degree intervals. The lower susceptor 126 is generally circular and rests inside the aperture in the support plate 132. The lower susceptor 126 has four approximately semicircular inner cutouts 134 co-located with the outer cutouts 133. Each inner cutout 134 paired with its respective inner cutout 133 forms a circular niche accommodating a cylindrical support pin 130. The distal end, with respect to the bodies X1 and X2, of each of four support pins 130 is affixed to the support plate 132 in its respective outer cutout 133.

Figure 4:
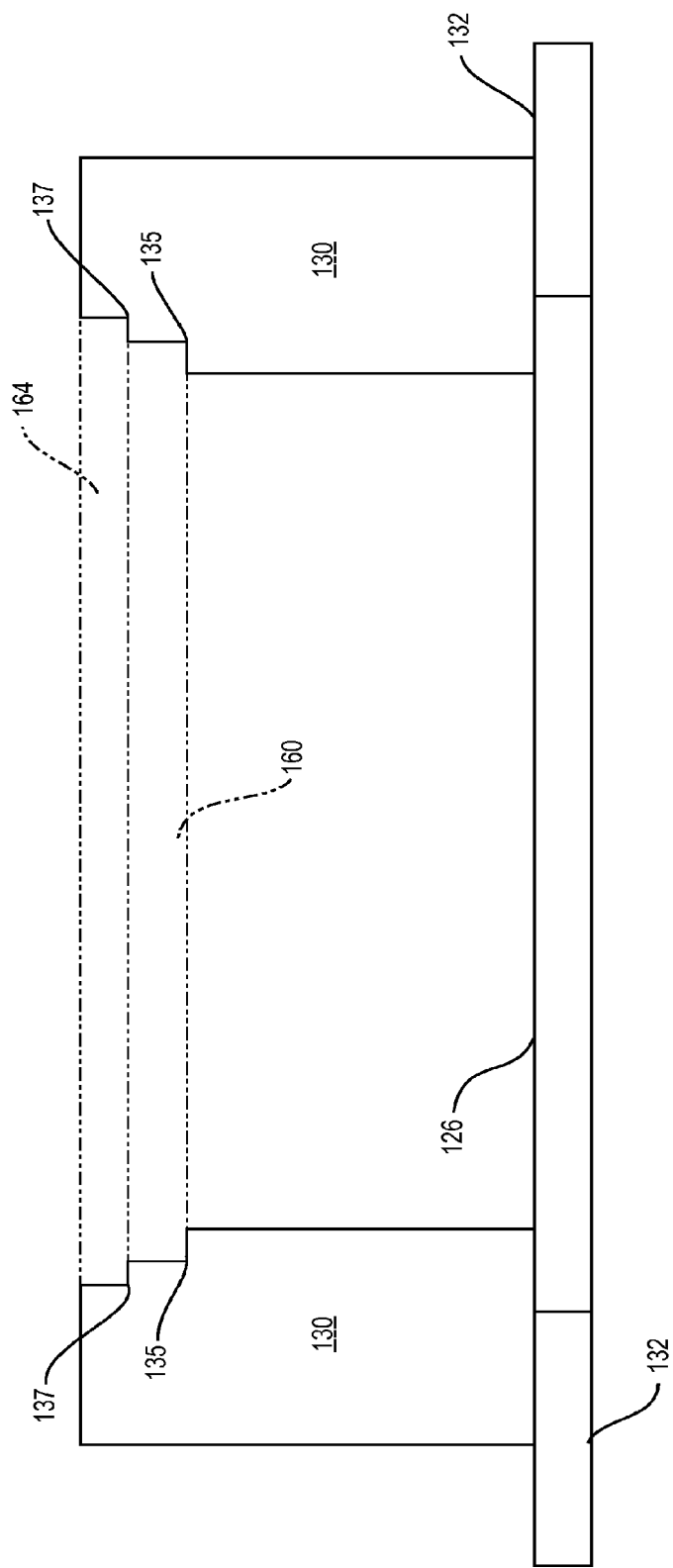
FIG. 4 is a sectional view of the support plate and pins shown in FIG. 3, taken through pins at each end of a diameter of the first or second body.
Figure 5:
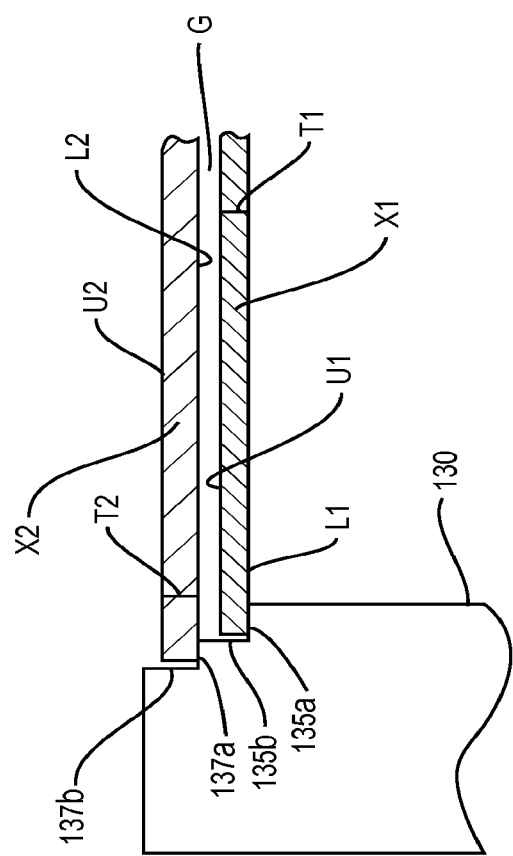
FIG. 5 is a sectional view of the support pin, shown in FIG. 3, supporting the first and second bodies.

The proximal end of each of the support pins 130 is contoured, as shown in FIGS. 4 and 5, to support the first and second bodies X1 and X2. Each of the pins 130 has a lower horizontal ledge 135a and a lower vertical wall 135b constituting a lower step 135. The lower vertical walls 135b are cylindrically arcuate to accommodate a circular body. The lower steps 135 are disposed around, and in aggregate constitute a lower shelf 135 defining a first interior space 160. The first interior space 160 corresponds in lateral extent, two dimensionally, to the first body X1. As used herein, an interior space's corresponding in lateral extent to a body means that the interior space is laterally larger than the body by a clearance desirable for easily loading and removing the body from the shelf defining the interior space. Illustratively, for thin circular bodies such as semiconductor wafers, such a clearance is present when an interior space is about 0.05 to 1.0 mm greater in lateral extent than its corresponding body.

Each of the pins 130 furthermore has an upper horizontal ledge 137a and a cylindrically arcuate upper vertical wall 137b constituting an upper step 137. The upper steps 137 are disposed around, and in aggregate constitute an upper shelf 137 defining, a second interior space 164. The second interior space 164 corresponds in lateral extent, two dimensionally, to the second body X2.

The height of the upper vertical walls 137b is sufficient to reliably contain the second body X2 in place on the horizontal ledges 137a against adventitious lateral force, or illustratively, equal to at least about half the thickness T2 of the second body X2.

The discrete support pins 130 leave most of the respective peripheries of the first and second interior spaces 160 and 164 unencumbered. The free peripheries facing the input and output ports 35 and 45 allows access to the interior spaces 160 and 164, between the support pins 130, by the input and output shuttles 30 and 40, as discussed below.

The second interior space 164 has a lateral dimension longer than a corresponding dimension in the first interior space 160, the lateral dimension and its corresponding dimension in the first interior space 160 both lying in a common vertical plane. The larger extent of the second interior space 164 in the lateral dimension permits configuration of the lower susceptor 126 to pass through the first and second interior spaces 160 and 164 and thereby lift both the first and second bodies X1 and X2 disposed is on the lower and upper shelves 135 and 137.

In the embodiment, the second interior space 164 is larger in lateral area than the first interior space 160 and overhangs it completely. The lower and upper steps 135 and 137 delimit concentric circles approximately equal in size to the diameters of the first and second bodies X1 and X2, respectively. The circle delimited by the lower steps 135 may illustratively have a diameter approximately equal to that of a standard semiconductor wafer. The circle delimited by the upper steps 137 may be larger in diameter than the circle delimited by the lower steps 135 by, for example, approximately 5 mm or more.

In alternative embodiments, either or both of the lower and upper shelves 135 and 137 may be configured so that either or both of the first and second interior spaces 160 and 164 corresponds in lateral extent, two dimensionally, to a noncircular body, for example a square or octagonal body. The lower susceptor 126 may be configured so that its shape corresponds to the first body X1, and accordingly in embodiments may be, e.g., circular, square, or octagonal such as a corner-clipped square. The first and second interior spaces 160 and 164 may be dissimilar in shape. For example, the first body X1 may be a circle and the second body X2 a square having an edge length equal to the diameter of the first body X1.

The vertical distance between the lower and upper horizontal ledges 135a and 137a, which in the embodiment is the height of the lower vertical wall 135b, is greater than the thickness T1 of the first body X1. This distance creates an initial gap G between the bonding surfaces, which are the portions of the upper surface U1 of the first body X1 and the lower surface L2 of the second body X2 that overlap when one of the bodies is projected onto the other. In the embodiment, the bonding surfaces are the entire upper surface U1 of the first body X1 and its vertical projection onto the lower surface L2 of the second body X2. The gap G affords management of bond front nucleation and progression, for example by evacuation of the bonding chamber 20 before contact initiation, without intermediate spacers or other solid bodies touching the bonding surfaces on U1 and L2.

With reference again to FIG. 1, the input shuttle 30 is configured to convey the is first and second bodies X1 and X2 to be bonded through the input port 35 into the bonder chamber 20 and position them for processing on the lower and upper shelves 135 and 137. The provision of opposing ports 35 and 45 and dedicated respective shuttles 30 and 40 facilitates high throughput of the bonding chamber 20.

Figure 6:
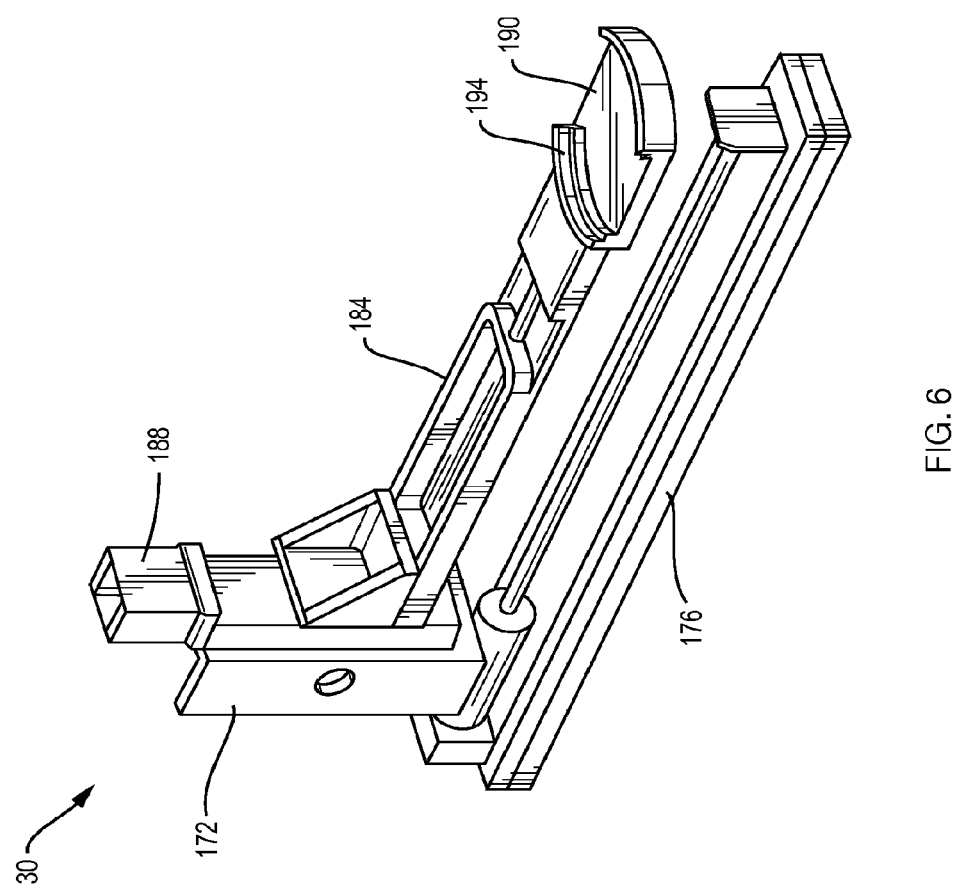
FIG. 6 is a perspective view of an input or output shuttle compatible with a bonding system of the invention.

Turning to FIG. 6, the input shuttle 30 has a block 172 that slides toward and away from the input port 35 along a horizontal drive assembly 176. The horizontal drive assembly 176 is actuated by a horizontal drive motor (not shown). An arm 184 is attached to the block 172 and is driven to move vertically by a vertical drive assembly 188 actuated by a vertical drive motor (not shown). The arm 184 bears an end effector 190 equipped with shuttle shelves 194 delimiting lower and upper footprints corresponding to the first and second interior spaces 160 and 164, respectively. A sensor (not shown), such as an optical sensor, may be configured, e.g., on the arm 184 or the base plate 50 (FIG. 1) to sense the presence or absence of bodies on the end effector 190 and/or the arrangement of bodies on the shuttle shelves 194.

The horizontal drive assembly 176 is mounted to the base plate 50 (FIG. 1) in a position and orientation allowing the arm 184 to move through the input port 35 of the bonding chamber 20 and situate the shuttle shelves 194 in alignment over the second interior space 164. The vertical drive assembly 188 is operable to lower the arm 184 so that the end effector 190 transfers bodies settled on the shuttle shelves 194 onto the lower and upper shelves 135 and 137. In alternative embodiments, the input shuttle 30 may be configured to effect horizontal and vertical motion of the end effector 190 by alternatives to the horizontal and vertical drive assemblies 176 and 188 known to those skilled in the art.

The shuttle shelves 194 are located on the end effector 190 so as to fit between the support pins 130. For example, the embodiment of the shuttle 30 depicted in FIG. 6 has shelves occupying an arc of less than 90 degrees at the front and back ends of the end effector 190.

Referring again also to FIG. 1, the output shuttle 40 is structured analogously to the input shuttle 30. The horizontal drive assembly 176 of the output shuttle 40 is mounted to the base plate 50 in a position and orientation allowing the end effector 190 is of the output shuttle 40 to be moved into position under the interior spaces 160 and 164 and lift bodies, as in a bonded pair created from the first and second bodies X1 and X2, from the upper shelf 137 and move them out of the bonding chamber 20 through the output port 45. The complementary design of the support pins 130 and the input and output shuttles 30 and 40 and the ability to load and unload from opposite sides of the bonding chamber 20, afforded by the distinct, dedicated input and output shuttles 30 and 40, may enhance throughput of the bonding system 10.

Figure 7:
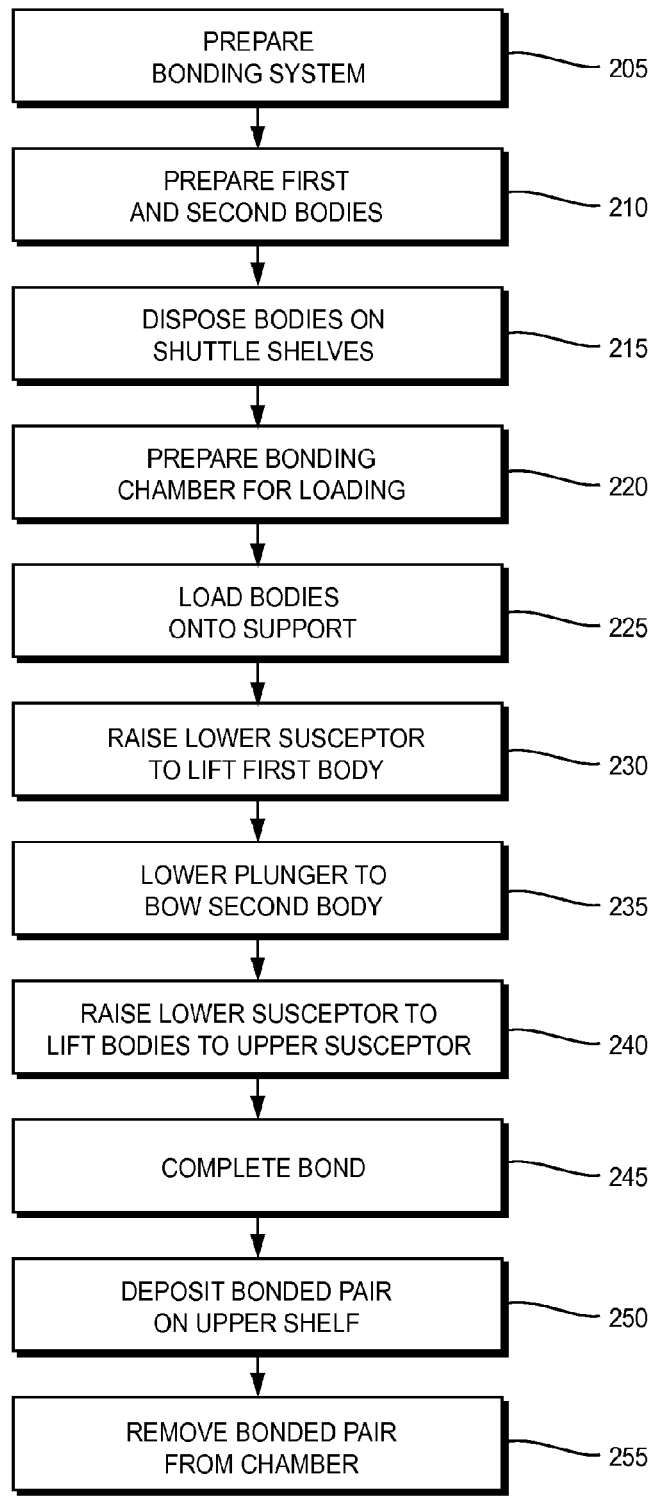
FIG. 7 is a flow diagram of an illustrative bonding process compatible with the invention.

FIG. 7 demonstrates steps in an exemplary process sequence for bonding two generally planar bodies X1 and X2 together. The computer system 80 (FIG. 1) is operated to prepare the bonding system for use (step 205) by, e.g., positioning the input and output shuttles 30 and 40 outside the chamber 20, closing the input and output ports 35 and 45, putting the bonding chamber 20 into rest position by setting the lower susceptor 126 below the first interior space 160 and retracting the plunger tip above the second interior space 164 and out of the way of the input shuttle 30. The computer system 80 may be furthermore operated to activate the lower and upper heaters 120 and 140 to bring the respective susceptors 126 and 146 to a preliminary elevated temperature, for example between 200° C. and 600° C., which is lower than the predetermined susceptor bonding temperatures, and fill the chamber 20 with a desired preliminary gaseous environment.

The first and second bodies X1 and X2 are prepared for bonding (step 210). The bodies X1 and X2 each may have a high aspect ratio, on the order of 100 or more, between a lateral dimension and thickness and opposing upper and lower surfaces that are substantially flat and parallel. According to the end use of the bonded pair, preparation of a body may comprise procedures known to those skilled in the art, e.g., growing or casting the body to a custom or standard diameter, e.g., 150 mm, 200 mm or 300 mm, 400 mm or greater, compatible with one of the lower and upper shelves 135 and 137; removing the body from a larger ingot such as by slicing; etching one or more faces of the bodies X1 and X2 to a desired surface roughness; diffusion doping the body to create an n-type or p-type layer; fabricating wiring; depositing a transparent conductive oxide or an amorphous silicon layer; depositing or growing an oxide or nitride layer; depositing a is conductive layer or stack of layers; and cleaning surfaces of the body such as by megasonic rinsing with spin drying or otherwise treating surfaces to remove chemical residues and particles, for example any particles exceeding 2 μm in diameter.

Depending on the type of bonding to be accomplished in the bonding chamber 20, one or both of the bodies X1 and X2 may be coated on one side with an adhesive or a fusible substance that melts during bonding to join the two bodies; or one or more surfaces of the bodies may activated with plasma. Body preparation for techniques such as thermo compression, adhesive, plasma and anodic bonding are described in co-owned U.S. patent application Ser. No. 12/335,479, Agarwal et al., "Methods of Transferring a Lamina to a Receiver Element," the disclosure of which is incorporated herein in its entirety by reference. As used herein, the upper surface U1 of the first body X1 and the lower surface L2 of the second body X2 refer to the uppermost or lowermost, respectively, surface of the respective body when it is placed on the lower or upper horizontal ledges 135a and 137a, respectively, whether the surface U1 or L2 represents the bulk, interior material of the respective body, X1 or X2, or a surface coating or layer, for example, an applied material.

One or both of the bodies X1 and X2 may be of an electronics-grade semiconductor material, such as silicon, germanium, silicon germanium, or a III-V or II-VI compound such as gallium arsenide or indium phosphide. The semiconductor material may have a monocrystalline, polycrystalline, multicrystalline or microcrystalline microstructure. Polycrystalline and multicrystalline semiconductors are understood to be completely or substantially crystalline. A polycrystalline semiconductor body is comprised of crystals on the order of 1 mm in size. A multicrystalline semiconductor body has a grain size on the order of 1,000 Angstrom units. By contrast, a microcrystalline semiconductor may be fully crystalline or may include fine microcrystals in an amorphous matrix. Microcrystals in a microcrystalline semiconductor body are on the order of 100 Angstrom units in size. One of the bodies X1 and X2 may be of glass, ceramic, metal, metal-containing compound, plastic, metallurgical silicon, or a layered stack of diverse materials.

With reference again to FIG. 6, the prepared first and second bodies X1 and X2 is are placed flat onto the shuttle shelves 194 of the input shuttle end effector 190 in a substantially parallel, spaced-apart stack. (step 215) The bodies may be placed onto the shuttle shelves 194 manually or by a robot, for example. A sensor may be activated to verify correct positioning of the first and second bodies X1 and X2 on the end effector 190.

Once correctly positioned on the end effector 190, the bodies X1 and X2 may be preheated. The input shuttle 30 may be operated to position the first and second bodies X1 and X2 in a preheat station (not shown in the drawings). The preheat temperature, and respective temperatures of other environments in which the bodies reside during the process sequence, are chosen for compatibility with process steps in light of considerations such as time efficiency and thermal budget. For example, a higher preheat temperature may shorten the overall bonding process time but also prematurely initiate other thermally activated processes more preferably occurring in later process steps.

The bonding chamber 20 is prepared for loading (step 220) by increasing the output of the heaters 120 and 140 to bring the susceptors 126 and 146 to respective bonding process temperatures, either of which may be e.g., on the order of 200° C., 300° C., 400° C., 500° C., 600° C., 700° C., 800° C., or greater. Illustratively the bonding temperature of both of the susceptors 126 and 146 are approximately equal and lie between 200° C. and 800° C., between 350 and 550° C., or between 400 and 500° C. The bonding chamber 20 is purged with nitrogen as the input port 35 is opened.

The input shuttle 30 is operated to load the bodies X1 and X2 onto the support pins 130 (FIG. 2) in the bonding chamber 20. (step 225) The computer 80 (FIG. 1) directs the vertical drive assembly 188 (FIG. 6) to adjust the elevation of the end effector 190 for positioning over the support pins 130. The horizontal drive assembly 176 (FIG. 6) is directed to advance the arm 184 through the input port 35 (FIG. 1) until the end effector 190 is positioned for loading. The vertical drive assembly 188 then lowers the arm 184 until the bodies X1 and X2 are settled on the lower and upper shelves 135 and 137 (FIG. 5), respectively. A sensor (not shown) on the input shuttle 30 or inside the bonding chamber 20 may verify proper placement of the bodies. When placement is satisfactory, the horizontal drive assembly 176 retracts the end effector 190 from the is bonding chamber 20.

Figure 8:
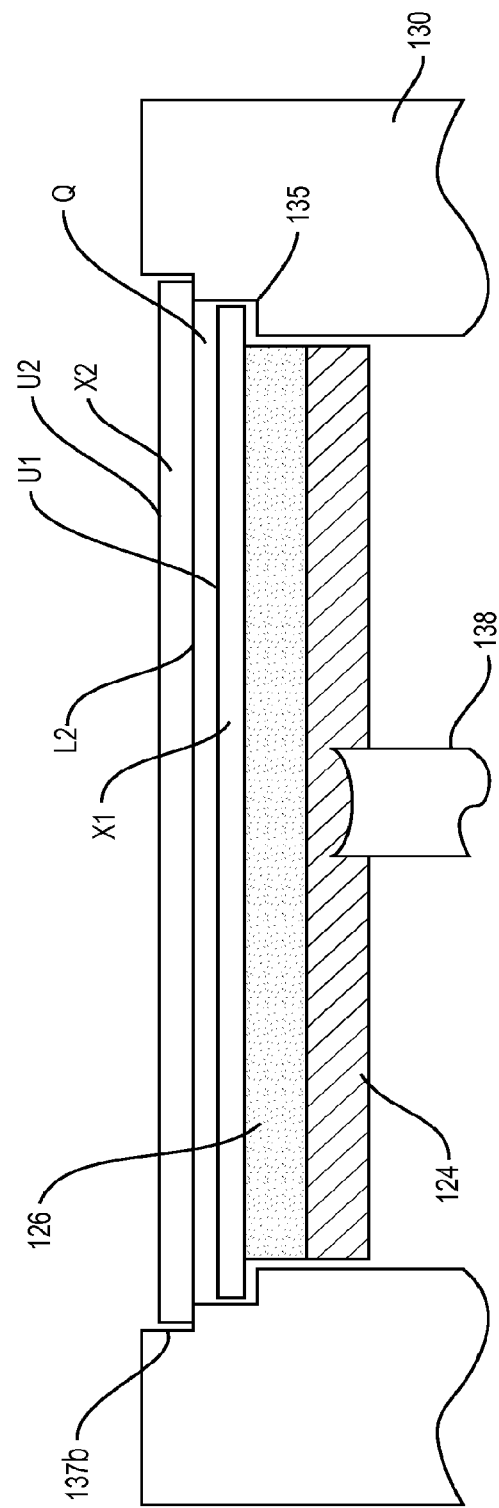
FIG. 8 is a sectional view of the elevated lower susceptor lifting the first body in the bonding chamber shown in FIG. 2.

Next, the input port 35 is closed, the nitrogen purge ended and the bonding chamber 20 evacuated. After sufficient time for thermal equilibration in the bonding chamber has passed, the susceptor lift assembly 138 is activated to raise the lower susceptor 126 until the lower susceptor 126 has lifted the first body X1 from the lower shelf 135. (step 230) With reference to FIG. 8, at the end of step 230 the lower susceptor 126 has come to rest holding the upper surface U1 of the first body X1 at a predetermined separation Q from the lower surface L2 of the second body X2, which remains on the upper shelf 137.

Figure 9:
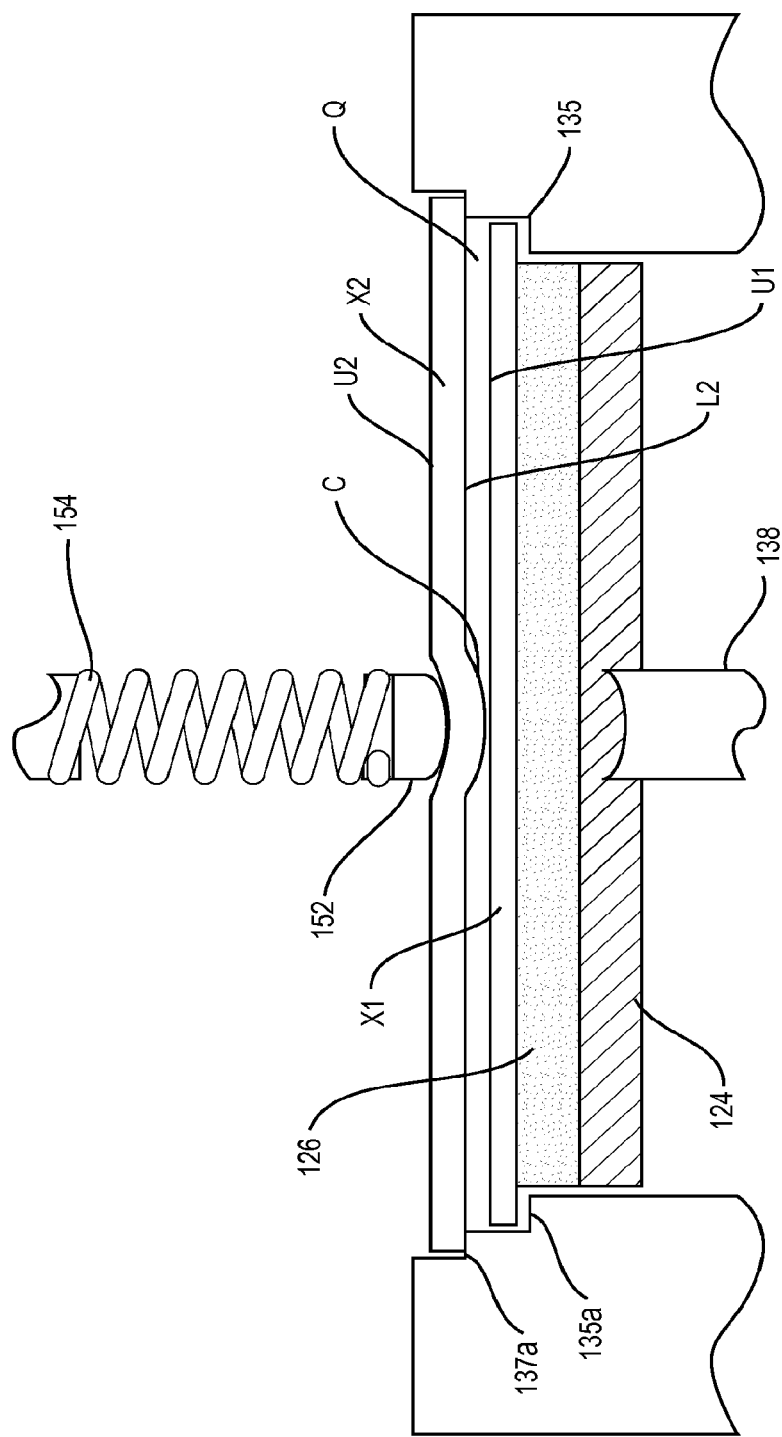
FIG. 9 is a sectional view of the elevated lower susceptor lifting the first body and the plunger tip depressing the second body in the bonding chamber shown in FIG. 2.

Referring back to FIG. 2, the plunger drive 158 is next activated to drive the plunger 150 downward so that the tip 152 touches the upper surface U2 of the second body X2 with force sufficient to bow the second body X2, forming a convexity C approximately at the center of its lower surface L2, facing the first body X1. (step 235) With reference to FIG. 9, at the end of step 235, the separation Q remains between the upper surface U1 and the lower surface L2 near the horizontal ledges 135a. Under the plunger tip 152 the first and second bodies X1 and X2 approach closer than the predetermined separation Q.

Figure 10:
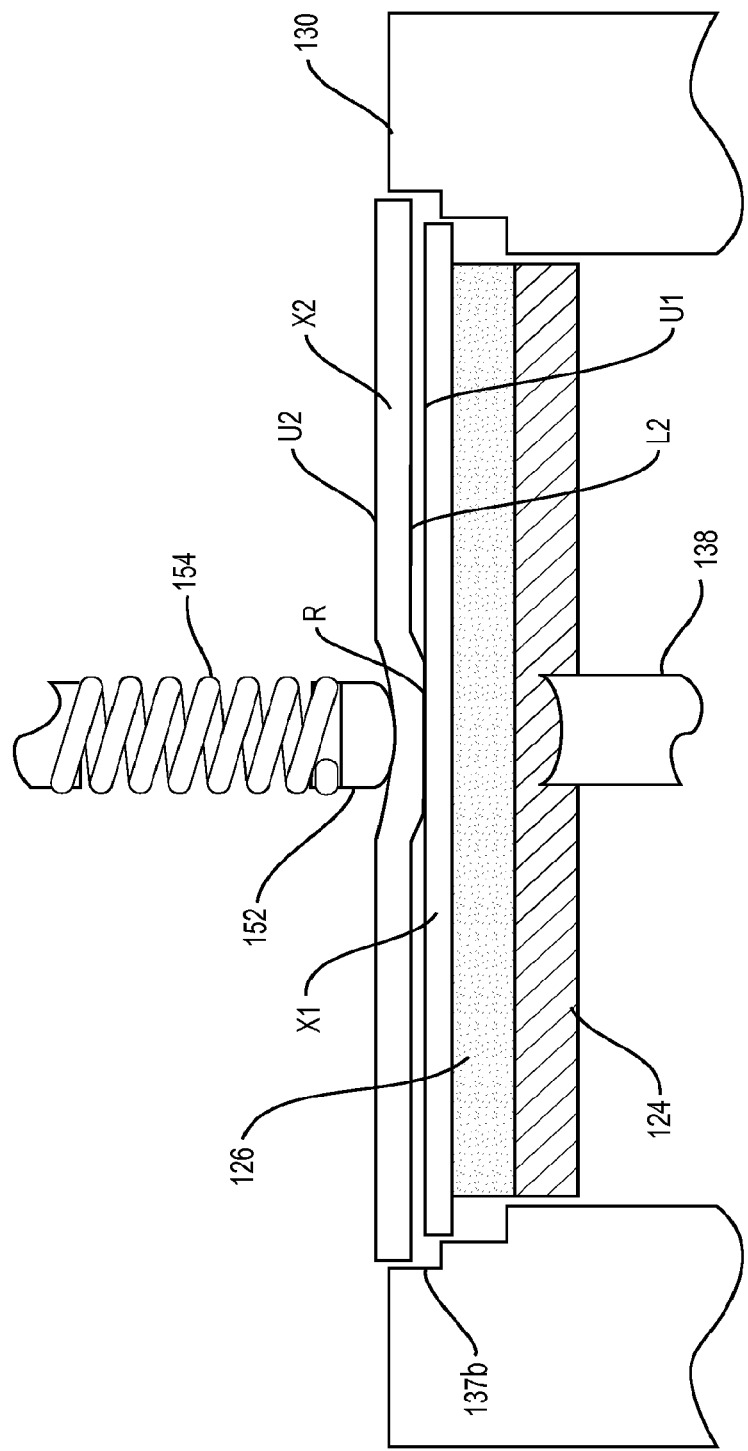
FIG. 10 is a sectional view of the elevated lower susceptor lifting the first body to expand the contact area with the second body in the bonding chamber shown in FIG. 2.
Figure 11:
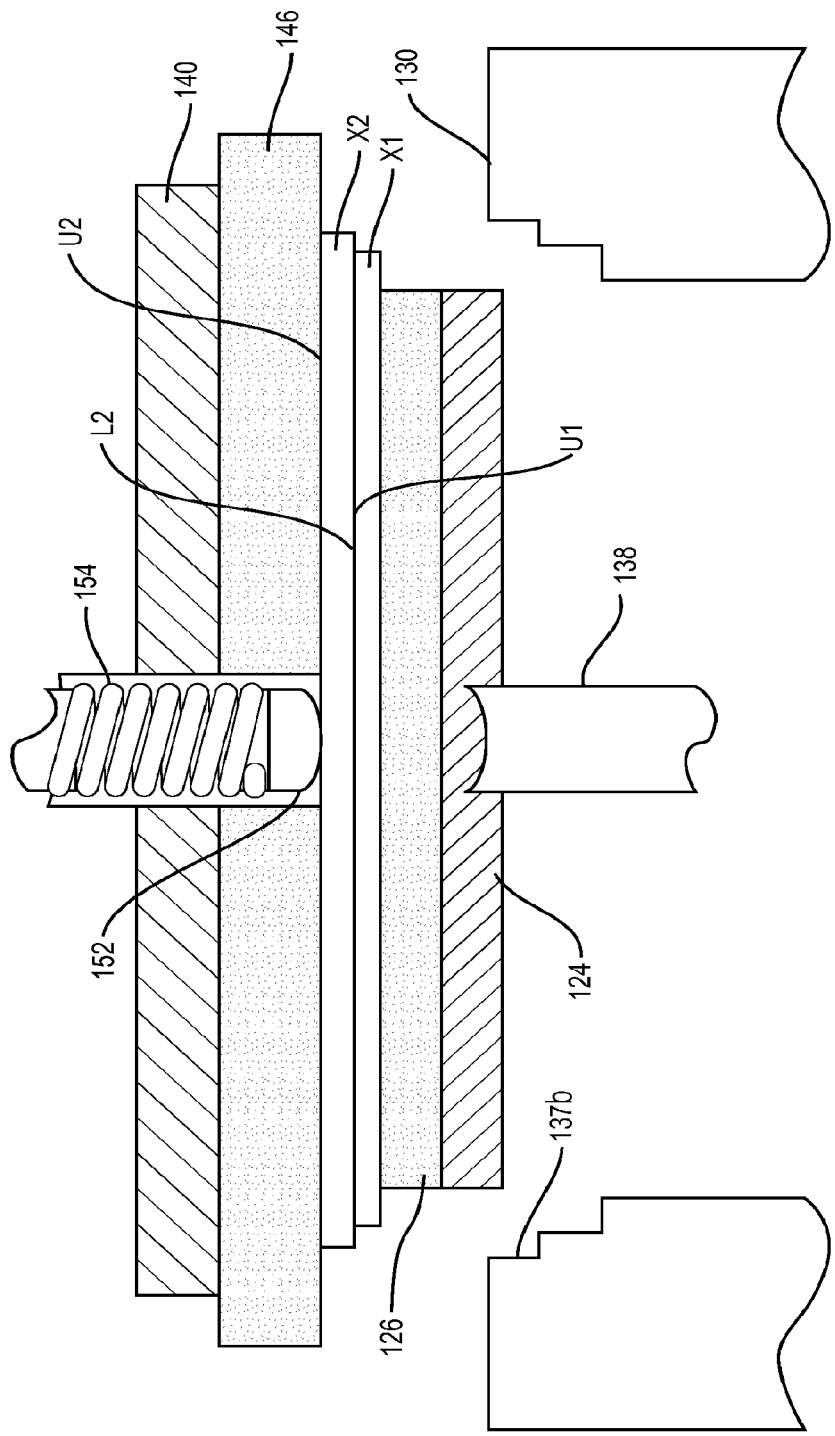
FIG. 11 is a sectional view of the bonded first and second bodies pressed between the lower and upper susceptors of the bonding chamber shown in FIG. 2.

The susceptor lift assembly 138 resumes upward motion to bring the second body X2 against the upper susceptor 146 (FIG. 2) (step 240). In one approach, the elevation of the plunger drive assembly 158 is fixed during step 240. When the first body X1 rises sufficiently to close the separation Q under the convexity C, contact is initiated between the upper surface U1 and the lower surface L2. Ideally, the contact occurs over a continuous circular interface region R, as shown in FIG. 10. As the first body X1 lifts the second body X2 off the upper shelf 137 and continues upward, the spring 154 is compressed and the force of the tip 152 against the upper surface U2 of the second body X2 increases. The contact front around the circular interface region R may advance approximately radially. FIG. 10 shows the second body X2 supported by the first body X1 through the contact region R. The susceptor lift assembly 138 continues upward until the contact region R substantially covers the entire upper surface U1 and the upper is surface U2 of the second body X2 is against the upper susceptor 146, as shown in FIG. 11.

Alternatively, during step 240 the plunger drive 158 (FIG. 2) is operated to track the position of the upper surface U2, thus retracting as the second body X2 rises, thereby maintaining a constant force between the tip 152 and the upper surface U2. Also, the contact region R may be precipitated by the initial descent of the plunger tip 152 in step 235 instead of in step 240.

In step 245, the first and second bodies X1 and X2 are held under pressure between the respective lower and upper susceptors 126 and 146 (FIG. 2) until the contact area R is converted to a bond. The compression may be maintained, for example for a predetermined period on the order of one minute, five minutes, thirty minutes or more. In general, completion of the bond at the upper surface U1 of the first body X1 and the lower surface L2 of the second body X2 involves the application of pressure between the susceptors 126 and 146 and the transfer of heat from the susceptors 126 and 146 through the respective bodies X1 and X2 to the contact region R. Step 245 may additionally involve, for example, the application of a bias voltage across the bodies X1 and X2 to achieve anodic bonding. Alternatively, the bond is completed by the fusion and solidification of material at the upper surface U1 or lower surface L2, for example, a preapplied metal coating applied to one or both of the surfaces U1 and L2 during step 210. Diverse bonding techniques are described in U.S. patent application Ser. No. 12/335,479, earlier incorporated by reference.

When the bond is complete, the susceptor lift assembly 138 (FIG. 2) is retracted to remove the upper surface U2 of the second body X2 from the upper susceptor 146. The plunger drive 158 may be engaged to push the plunger assembly 150 downward to help separate the upper surface U2 of the second body from the upper susceptor 146. The plunger tip 152 may furthermore follow the upper surface U2, either by passive extension of the spring 154 or under force from the plunger drive 158. In this case, the presence of the plunger tip 152 on the upper surface U2 may inhibit undesired lateral motion on the lower susceptor 126 by the bonded pair formed from X1 and X2.

When the unbonded portion of the lower surface L2 reaches the horizontal ledge 137a of the upper shelf 137 (FIG. 5), the bonded pair comes to rest and the lower susceptor 126 continues to its rest position below the lower shelf 135. (step 250) At this point, the plunger tip 152 may be retracted into the upper susceptor 146.

Referring again to FIG. 1, the power apparatus 90 and the atmosphere apparatus 100 of the bonding system 10 are operated to bring the environment in the bonding chamber 20 to a suitable temperature and composition for opening the chamber 20, for example by cutting off vacuum or backfilling with an inert gas such as nitrogen. The output port 45 is opened and the output shuttle 40 is operated to lift the bonded pair off the upper shelf 137 (FIG. 4) and remove it from the chamber 20. (step 255)

In an exemplary embodiment adapted to make a photovoltaic-ready silicon-glass structure by anodic bonding in the bonding system 10, the lower step 135 is configured to hold a wafer X1 about 150 mm in diameter with a clearance of about 0.2 mm around the perimeter. The lower horizontal wall 135a is about 2 mm in radial extent and the lower vertical wall 135b is greater than about 3 mm tall. The upper shelf 137 is adapted to contain a second body X2 approximately 1.0 mm to 3.5 mm in thickness and 154 mm in diameter, also with a clearance of about 0.2 mm around the perimeter. The upper horizontal shelf 137a is about 2 mm in radial extent and the upper vertical wall 137b is about 2 mm tall. The lower and upper steps 135 and 137 are shaped in the proximal ends of respective quartz support pins 130.

The power apparatus 90 incorporates 60 mA power supply configured to apply a bias voltage between the lower and upper susceptors 126 and 146. The plunger tip is 10 mm in diameter and of silicon carbide. The susceptors 126 and 146 are also of silicon carbide, which resists attack by sodium ions in contact with a glass body under bias.

With reference again to FIG. 7, in step 205, the lower 126 and upper susceptors 146 in the bonding chamber 20 are heated to a preliminary elevated temperature of about 450° C.

The bonding chamber 20 is filled with nitrogen gas at approximately atmospheric pressure.

Figure 12:
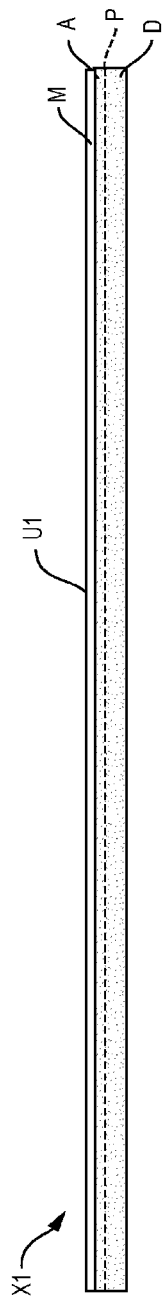
FIG. 12 is a sectional view of a semiconductor wafer implanted with ions to create a cleave plane defining a lamina portion and a donor portion.

In step 210, the first body X1 is prepared by providing a round silicon monocrystal, referred to as a silicon wafer, illustratively on the order of 0.7 mm thick and 150 mm in diameter. The silicon wafer X1 is furthermore implanted with $8 \times 10^{16}$ is hydrogen ions/cm² through what becomes the upper surface U1 when the silicon wafer X1 is placed in the bonding chamber 20. With reference to FIG. 12, the implanted hydrogen ions define a cleave plane P, illustratively about 3.0 µm below the upper surface U1 and defining a lamina portion A of the silicon wafer, between the cleave plane P and the upper surface U1 and a donor portion D between the cleave plane P and the lower surface L1 of the silicon wafer X1. The lamina portion A is subject to exfoliation from the donor portion D at the cleave plane P, e.g., upon annealing at high temperature.

In alternative embodiments, the silicon wafer may be implanted with, e.g., helium ions, alone or in addition to hydrogen, and the cleave plane may be from about 0.2 µm to 20 µm, or between 1 µm and 5 µm, below the upper surface U1 of the silicon wafer. The total implanted ion concentration may alternatively be between about $4 \times 10^{16}$ and $2 \times 10^{17}$ ions/cm. Details of creating lamina portions in semiconductor materials by ion implantation and subsequent exfoliation are described in co-owned U.S. patent application Ser. No. 12/407,064, Petti et al., "Method to Make Electrical Contact to a Bonded Face of a Photovoltaic Cell," the disclosure of which in its entirety is incorporated herein by reference.

The second body X2, referred to here as a receiver element, is a round substrate of borosilicate glass, illustratively about 1.1 mm thick and 400 mm in diameter. The close match between the thermal expansion properties of borosilicate glass and the wafer material facilitate post-bonding handling of the bonded pair. Alternatively, the receiver element could be of soda lime glass.

The upper surface U1 of the semiconductor wafer X1 (as shown in FIG. 12) or the lower surface L2 of the receiver element X2 is illustratively covered, e.g., by sputtering, with a conductive and/or reflective metallic material to form a layer M. In an alternative approach, material added to both of the upper surface U1 and the lower surface L2 constitutes the layer M. The material in the layer M may be of titanium or aluminum or silicides thereof. Alternatively or additionally, the metallic layer may include a metal such as chromium, molybdenum, tantalum, zirconium, vanadium, tungsten, nickel, copper, silver, ruthenium, niobium, cobalt, zinc, indium, antimony, tin, lead, iron or an alloy, oxide, silicide or other compound thereof, or combination thereof. The layer M is may be between about 30 Angstrom units and 2,000 Angstrom units thick, for example about 100 to 200 Angstrom units thick. Candidate materials for the semiconductor wafer X1, the receiver element X2, the layer M and its disposition are discussed in are described in U.S. patent application Ser. No. 12/335,479, earlier incorporated by reference, and co-owned U.S. patent application Ser. No. 12/057,265, Herner, "Method to Form a Photovoltaic Cell Comprising a Thin Lamina Bonded to a Discrete Receiver Element," the disclosure of which in its entirety is incorporated herein by reference.

In steps 215 through 225, the wafer X1 and receiver element X2 are disposed on the input shuttle 30, the setpoint for both of the lower and upper susceptors 126 and 146 is raised to a predetermined bonding process temperature of 450° C., and the wafer X1 and receiver element X2 are transferred to the support pins 130 by the input shuttle 30. The bonding chamber 20 is brought to a vacuum of about $10^{-4}$ millibar.

Once the susceptors 126 and 146 have reached the process temperature, in step 230 the lower susceptor 126 is raised to lift the wafer X1 off the lower horizontal ledge 135a until the upper surface U1 and the lower surface L2 of the receiver element X2 are separated by the predetermined separation Q. After about 30 seconds of contact between the lower susceptor 126 and the lower surface L1 of the wafer X1, the plunger drive 158 lowers the tip 152 to produce the convexity C, reaching about 0.05 mm downward, in the lower surface L2 of the receiver element X2 in step 235. The convexity C does not span the separation Q.

In step 240, the lower susceptor 126 is raised further to lift the wafer X1, which contacts the convexity C and further lifts the receiver element X2 until the wafer and receiver element are held together against the upper susceptor 146. In step 245, as the wafer X1 and receiver element X2 reach thermal equilibrium with the susceptors 126 and 146, the susceptor lift assembly 138 creates a bonding stress equal to about 5,000 Pa between the lower and upper susceptors 126 and 146. The power apparatus 90 is activated to apply a bias voltage of about 500 V between the lower and upper susceptors 126 and 146 for a predetermined biasing interval of, e.g., about 5 minutes.

In an alternative embodiment, instead of predetermining a biasing interval, the is computer system 80 may be configured to control the bias voltage in response to a monitored current passing across the contact area R. As bonding progresses, an oxide layer may form at the contact R, causing the current to decrease after attaining a peak value of about 10 to 30 mA and affording a metric by which to evaluate bonding progress.

When bonding is complete the first and second bodies have become a bonded wafer-receiver pair X12. After shutting off the bias voltage, the bonded wafer-receiver pair X12 is settled on the upper shelf 137 as the lower susceptor 126 retreats toward the support plate 132. (step 250) Finally, the bonded pair X12 is removed from the chamber 20 as described earlier for step 255.

Figure 13:
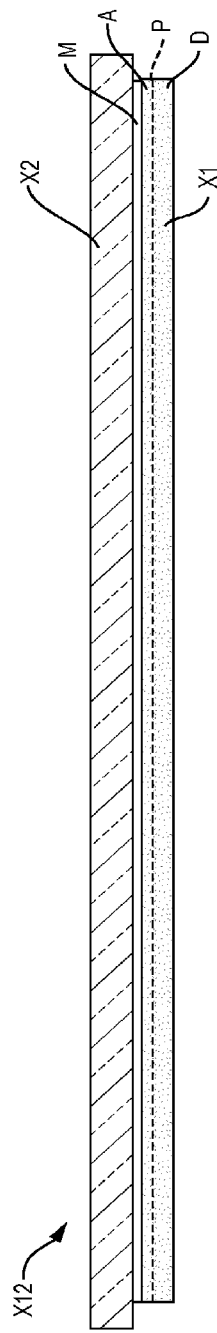
FIG. 13 is a sectional view of an ion-implanted semiconductor wafer bonded to a receiver body in accordance with the invention.
Figure 14:
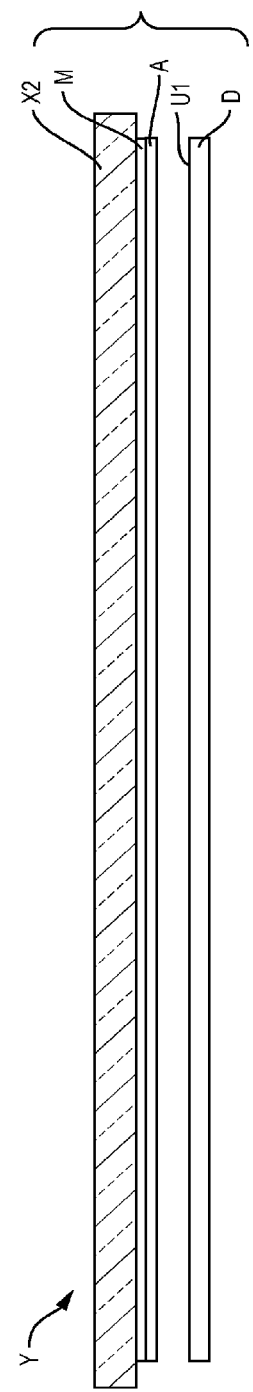
FIG. 14 is a sectional view of a bonded lamina-receiver assembly fabricated in accordance with the invention.

With reference to FIG. 13, the bonded wafer-receiver pair X12 is suitable for further treatment to form a bonded lamina-receiver assembly. Subjecting the bonded pair X12 to proper exfoliating conditions causes the lamina portion A to separate from the donor portion D, thereby rendering, in the embodiment, a bonded lamina-receiver assembly Y comprising the receiver element X2 with a 3-µm-thick lamina portion A affixed thereto, as shown in FIG. 14. Additional processing that may be performed in order to complete fabrication of the photovoltaic device are described in U.S. application Ser. Nos. 12/335,479 and 12/057,265, earlier incorporated by reference.

The separated donor portion D may be implanted again to define a consecutive cleave plane, through its lower surface L1 or new upper surface U1' exposed by exfoliation of the lamina A, and used as a first body in a subsequent bonding process. Illustratively, the semiconductor wafer X1 may be implanted, bonded to a receiver, and exfoliated multiple times. The cooperation of the moveable lower susceptor 126 with the configuration of the lower shelf 135 gives the bonding chamber 20 flexibility with regard to wafer thickness T1 that makes it suitable for bonding wafers to receivers in between repeated exfoliations. When an exfoliation renders the separated donor portion D thinner than some critical value, illustratively 300 µm, easily handled in the bonding chamber 20, the wafer X1 may be sold for repurposing or otherwise disposed of.

The bonding system 10 and related method afford a bonding method without the surface damage hazards, bonder chamber complexity, and reduced throughput associated with interposing spacers between the semiconductor and receiver element.

Although specific features of the invention are included in some embodiments and not in others, it should be noted that individual feature may be combinable with any or all of the other features in accordance with the invention. Furthermore, other embodiments are compatible with the described features. For example, the upper susceptor 146 may be configured to descend toward the upper surface U2 of the second body X2.

It will therefore be seen that the foregoing represents a highly advantageous approach to bonding, particularly for bonding planar bodies such as wafers and substrates. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of treating a first body having an upper surface, a lower surface, and a thickness and a second body having an upper surface and a lower surface, the method comprising:
    configuring a lower shelf, having a vertical wall and a horizontal ledge, around a first interior space corresponding in lateral extent to the first body;
    configuring an upper shelf, having a vertical wall and a horizontal ledge above the lower shelf and around a second interior space, corresponding in lateral extent to the second body, the second body being larger in lateral extent than the first body, so that the respective horizontal ledges of the upper and lower shelves are separated vertically by a distance greater than the thickness of the first body;
    disposing a lower heat-transfer body, having an upper interface, under and spaced apart from the first interior space;
    disposing an upper heat-transfer body, having a lower interface above and spaced apart from the second interior space;
    disposing the lower surface of the first body on the horizontal ledge of the lower shelf;
    disposing the lower surface of the second body on the horizontal ledge of the upper shelf; and
    raising the lower heat-transfer body to lift the first body above the horizontal ledge of the lower shelf, the first body in turn lifting the second body from the upper shelf, and press the first and second bodies together against the upper heat-transfer body until the first and second bodies form a bonded pair.

2. The method of claim 1 wherein the upper heat-transfer body has an aperture at a right angle to the lower interface and further comprising:
    configuring a plunger to reversibly descend through the aperture toward the second interior space; and
    lowering the plunger to contact the second body, thereby forming a convexity in the lower surface of the second body, contact between the first body and the second body initiating at the convexity and spreading over substantially the entire upper surface of the first body as the second body approaches the upper heat-transfer body.

3. The method of claim 1 further comprising imposing a bias voltage across the first and second bodies pressed together between the upper and lower heat-transfer bodies to effect an anodic bond.

4. The method of claim 1 wherein one of the first and second bodies is a semiconductor wafer.

5. The method of claim 1 wherein at least one of the upper surface of the first body and the lower surface of the second body represents an applied material distinct in composition from respective interior compositions of the first and second bodies.

6. The method of claim 1 wherein the first body is a semiconductor wafer and contains hydrogen or helium implanted beneath the upper surface, defining a cleave plane.

7. The method of claim 6 wherein the second body is a receiver and further comprising annealing the bonded pair to effect exfoliation of a lamina from the first body, thereby rendering a bonded lamina-receiver assembly.

8. The method of claim 6 wherein the first body is of monocrystalline silicon.

9. The method of claim 6 wherein the defined cleave plane is at least 1 micron below the upper surface of the wafer, the receiver is of glass and the bonded lamina-receiver assembly is suitable for fabricating a photovoltaic device.

10. The method of claim 1 further comprising coupling electromagnetic energy to the lower and upper heat transfer bodies.

\* \* \* \* \*